US009118099B2

(12) United States Patent
Kim et al.

(10) Patent No.: US 9,118,099 B2
(45) Date of Patent: Aug. 25, 2015

(54) BALUN CIRCUIT USING A DEFECTED GROUND STRUCTURE

(71) Applicant: KOREA UNIVERSITY RESEARCH AND BUSINESS FOUNDATION, Seoul (KR)

(72) Inventors: Moonil Kim, Seongnam-si (KR); Kook Joo Lee, Seoul (KR)

(73) Assignee: KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 0 days.

(21) Appl. No.: 14/364,905

(22) PCT Filed: Dec. 7, 2012

(86) PCT No.: PCT/KR2012/010658
§ 371 (c)(1),
(2) Date: Jun. 12, 2014

(87) PCT Pub. No.: WO2013/100432
PCT Pub. Date: Jul. 4, 2013

(65) Prior Publication Data
US 2014/0327491 A1 Nov. 6, 2014

(30) Foreign Application Priority Data
Dec. 26, 2011 (KR) ........................ 10-2011-0142395

(51) Int. Cl.
*H03H 7/42* (2006.01)
*H01P 5/10* (2006.01)
*H01P 3/08* (2006.01)

(52) U.S. Cl.
CPC ........................................ *H01P 5/10* (2013.01)

(58) Field of Classification Search
CPC ............... H03H 5/00; H03H 7/42; H01P 3/08
USPC ...................................... 333/25, 26, 238, 246
See application file for complete search history.

(56) References Cited

U.S. PATENT DOCUMENTS 4,882,553 A * 11/1989 Davies et al. ................... 333/26
5,594,393 A * 1/1997 Bischof ........................... 333/26

(Continued)

FOREIGN PATENT DOCUMENTS

JP 2005-109864 4/2005
KR 100715861 5/2007

(Continued)

OTHER PUBLICATIONS

International Search Report for International Application No. PCT/KR2012/010658 dated Mar. 26, 2013.

*Primary Examiner* — Dean Takaoka
(74) *Attorney, Agent, or Firm* — Kile Park Reed & Houtteman PLLC

(57) ABSTRACT

Disclosed is a balun circuit using defected ground structure. The balun circuit using a defected ground structure includes: a substrate; a ground surface formed on one surface of the substrate, the ground surface being formed with defect structure in a previously set shape; and two transmission lines formed on the other surface of the substrate opposing the ground surface, and separated from each other, and the defect structure of the ground surface is configured to have open circuit impedance characteristics, and one of the two transmission lines is grounded. An even mode signal is removed by using the defect ground structure having the open circuit impedance characteristics, and termination of total reflection characteristics is performed by using the grounding of one of the transmission lines. Accordingly, a balun circuit can be obtained which is small in size, has little loss at high frequency, and shows little change in characteristics due to the process error.

2 Claims, 5 Drawing Sheets

(56) References Cited

U.S. PATENT DOCUMENTS

| | | | | | |
|---|---|---|---|---|---|
| 6,023,210 | A * | 2/2000 | Tulintseff | 333/238 |
| 7,471,165 | B2 * | 12/2008 | Asamura et al. | 333/26 |
| 7,471,167 | B2 * | 12/2008 | Kim et al. | 333/26 |
| 7,586,386 | B2 * | 9/2009 | Takahashi | 333/26 |
| 2009/0140823 | A1 * | 6/2009 | Lee et al. | 333/26 |

FOREIGN PATENT DOCUMENTS

| | | |
|---|---|---|
| KR | 10-2009-0056626 | 6/2009 |
| KR | 10-2011-0061647 | 6/2011 |

* cited by examiner (a)

(b)

(a)

(b)

(a)

(b)

BALUN CIRCUIT USING A DEFECTED GROUND STRUCTURE

TECHNICAL FIELD

The present invention relates to a millimeter wave band integrated circuit (IC), and more particularly, to a balun circuit for conversion between a single mode and a differential mode.

BACKGROUND ART

Recently, system products using millimeter wave band such as 24 GHz and 77 GHz car radar, 60 GHz radio near field communication and 94 GHz RF-imaging are being actively researched.

Such system products using millimeter wave band are configured by combining various types of individual circuits. As millimeter wave band circuit, a single end type circuit is generally used. However, in case of a mixer circuit, a "Gilbert Cell" type circuit which is operated in a differential mode is mainly used due to advantage that LO-IF interference and even-order distortion are reduced.

According to recent research on an amplifier circuit having a high operation frequency, a virtual ground can be utilized, and a differential mode amplifier capable of improving noise characteristics compared with a single mode amplifier, is being much utilized.

As a single mode circuit is generally used, a balun circuit for effectively converting between signals of two modes is required in the entire system.

Due to enhanced performance of an active device together with development of semiconductor processes, operation frequency of millimeter wave band products gradually shifts to a high frequency band. At a high frequency band, degree of integration of products can be enhanced due to decrease in size of a passive circuit. However, compared with a case of a low frequency band, problem such as change in circuit performance due to loss increase and a process error may occur.

As a method for converting a signal into a differential mode using a single-end feed, a transformer may be used at a low frequency band of 3 GHz or less. The transformer, which uses a coil type inductor therein as an integrated circuit (IC), has a problem that great loss occurs at millimeter wave band.

A circuit such as a Marchand balun or a Rat Race is mainly used for conversion between a single mode signal and a differential mode signal at millimeter wave band.

FIG. 1 shows a view illustrating a circuit diagram (a) of a Marchand balun used to form a differential mode signal, and a Marchand balun substantially fabricated in an integrated circuit (IC) chip in accordance with the conventional art.

As shown in FIG. 1, the Marchand balun is implemented by using coupling of two transmission lines having ¼ wavelength, and the Rat Race is also implemented by using long transmission lines having ¾ wavelength.

Such circuits may occupy a large area in an IC chip, and may cause great loss at a high frequency of millimeter wave band. Especially, the Marchand balun is frequently used in designing an IC, due to broad bandwidth characteristics. However, the Marchand balun may cause great change in characteristics due to process error, because it is sensitive to coupling change between two transmission lines.

DISCLOSURE

Technical Problem

Therefore, an object of the present invention is to provide a balun circuit having a small size, little loss at high frequency, and shows little change in characteristics due to the process error.

Technical Solution

To achieve these and other advantages and in accordance with the purpose of the present invention, as embodied and broadly described herein, there is provided balun circuit using defected ground structure, which includes a substrate; a ground surface formed on one surface of the substrate, the ground surface being formed with defect structure in a previously set shape; and two transmission lines formed on the other surface of the substrate opposing the ground surface, and separated from each other, and the defect structure of the ground surface is configured to have open circuit impedance characteristics, and one of the two transmission lines is grounded.

An even mode signal is removed by using the defect ground structure having the open circuit impedance characteristics, and termination of total reflection characteristics is performed by using the grounding of one of the transmission lines. Accordingly, a balun circuit can be obtained which is small in size, has little loss at high frequency, and shows little change in characteristics due to the process error.

The defect structure may include a slot form configured in a direction crossing the two transmission lines, and a distance from an end portion of the defect structure to a part of the defect structure positioned at an opposite side to the transmission lines may be within the range of 80°~100° of a transmission signal waveform.

As a length from an end portion of the slot to a coupled-line is formed to have 90°, the ground surface can have open circuit impedance characteristics around the coupled-line.

The defect structure may be formed to have an 'H' shape symmetrical to the slot form. Under such 'H'-shaped structure, loss of radiation toward a rear end of the ground surface can be reduced.

The grounded transmission line may be connected to the ground surface. The circuit structure can be more simplified by connecting a ground of the grounded transmission line to a pre-fabricated ground surface.

Advantageous Effects

An even mode signal is removed by using the defect ground structure having the open circuit impedance characteristics, and termination of total reflection characteristics is performed by using the grounding of one of the transmission lines. Accordingly, a balun circuit can be obtained which is small in size, has little loss at high frequency, and shows little change in characteristics due to the process error.

As a length from an end portion of the slot to a coupled-line is formed to have 90°, the ground surface can have open circuit impedance characteristics around the coupled-line, in easier manner.

By using the 'H'-shaped structure, loss of radiation toward a rear end of the ground surface can be reduced.

The circuit structure can be more simplified by connecting a ground of the grounded transmission line to a pre-fabricated ground surface.

MODE FOR INVENTION

Hereinafter, preferred embodiments of the present invention will be explained in more detail with reference to the attached drawings.

Figure 1:
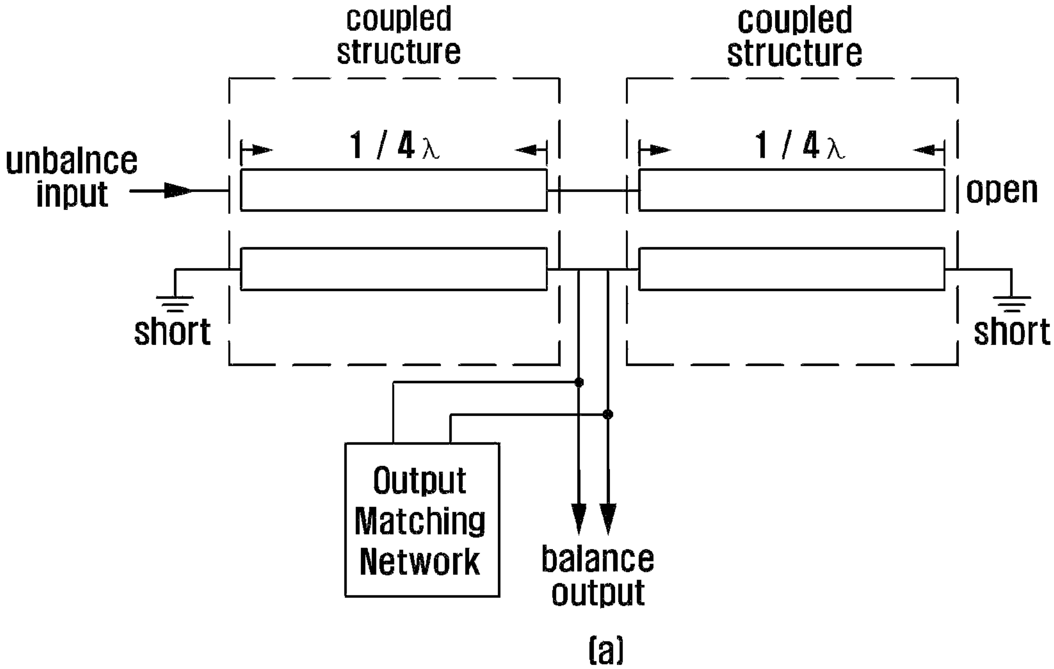
FIG. 1 (Prior Art)
FIG. 1 shows a view illustrating a circuit diagram (a) of a Marchand balun used to form a differential mode, and a Marchand balun substantially fabricated in an integrated circuit (IC) chip in accordance with the conventional art.
Figure 1:
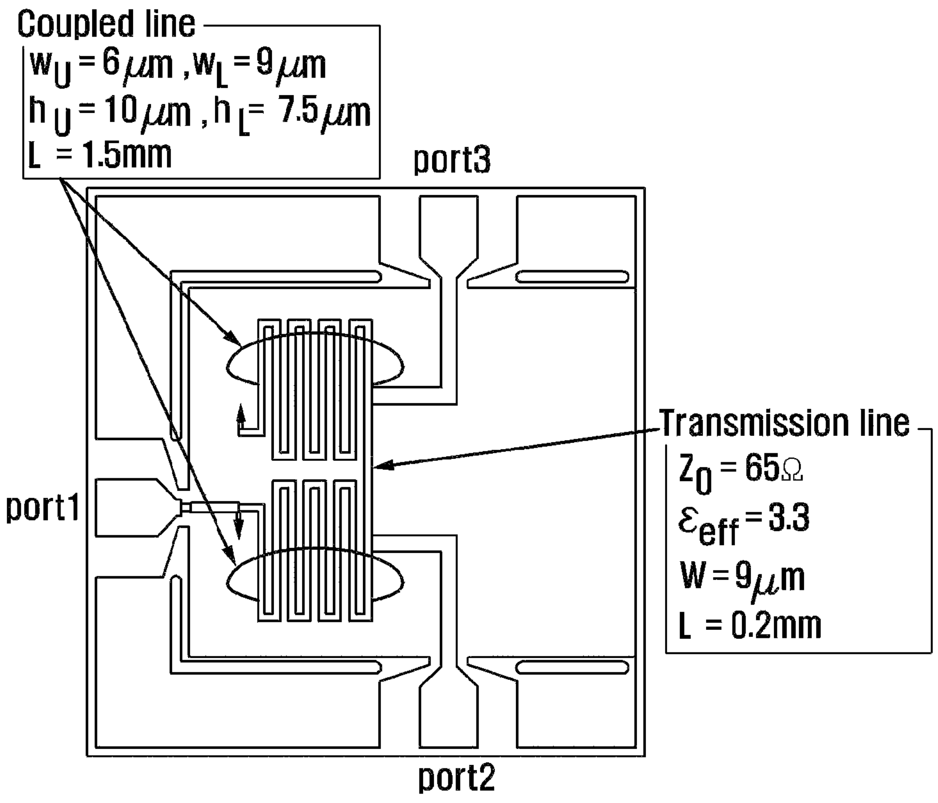
FIG. 1 (Prior Art)
Figure 2:
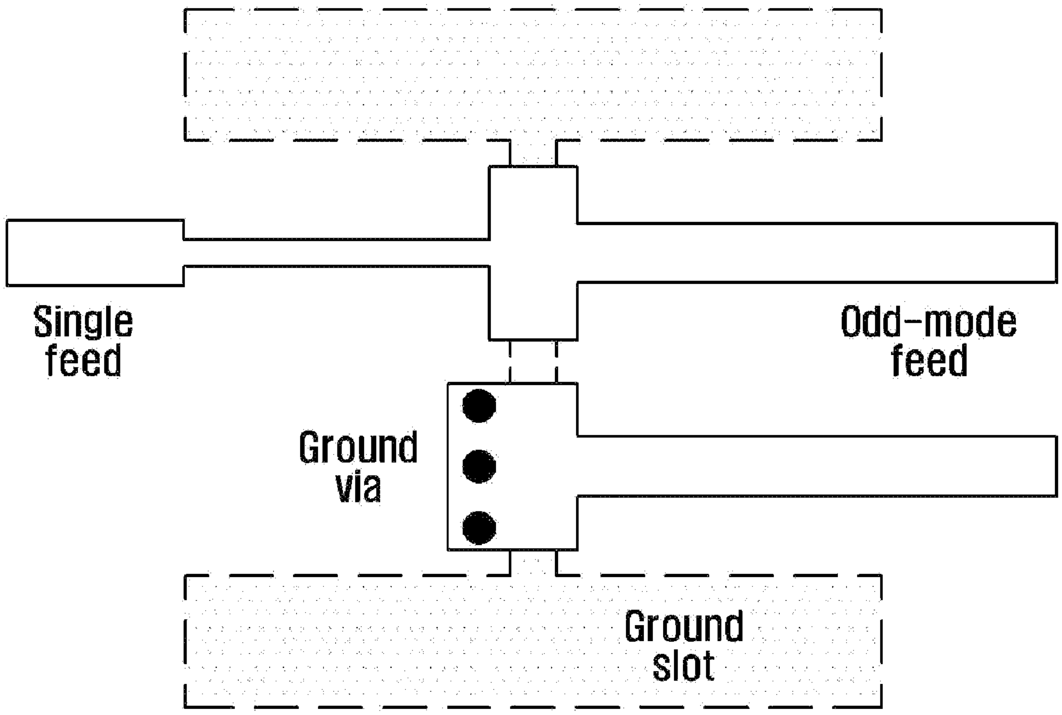
FIG. 2 shows a view schematically illustrating a small balun circuit designed using a ground surface slot structure according to an embodiment of the present invention.

FIG. 2 shows a view schematically illustrating a small balun circuit designed using a ground surface slot structure according to an embodiment of the present invention.

As shown in FIG. 2, a balun circuit proposed in the present invention may be simply configured using a short coupled-line, and a ground surface slot structure. The small balun circuit may be designed through formula analysis with respect to a coupled-line, a main component.

Figure 3:
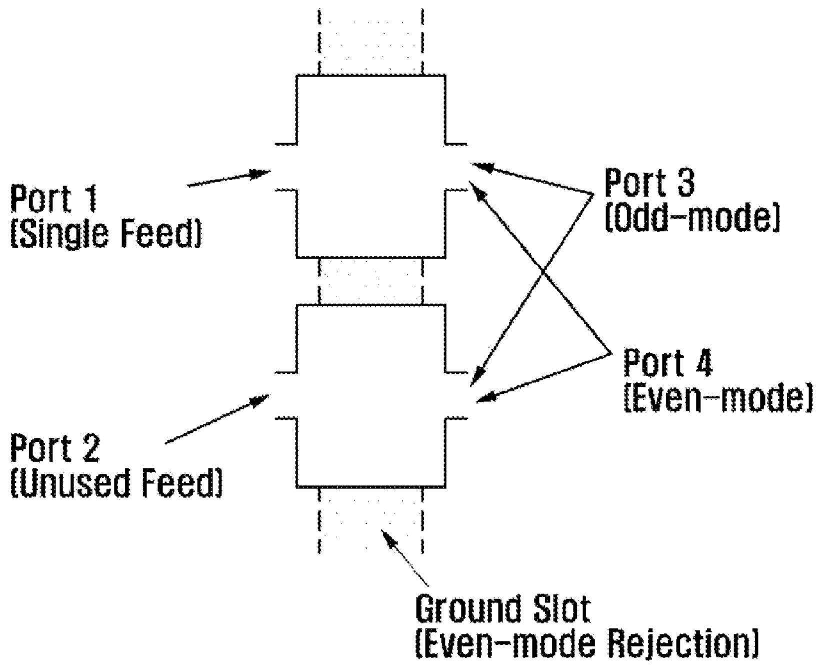
FIG. 3 shows a view (a) for explaining ports of a coupled-line, a main component of a balun circuit according to the present invention, and a block diagram (b) used to analyze performance of the balun circuit.
Figure 3:
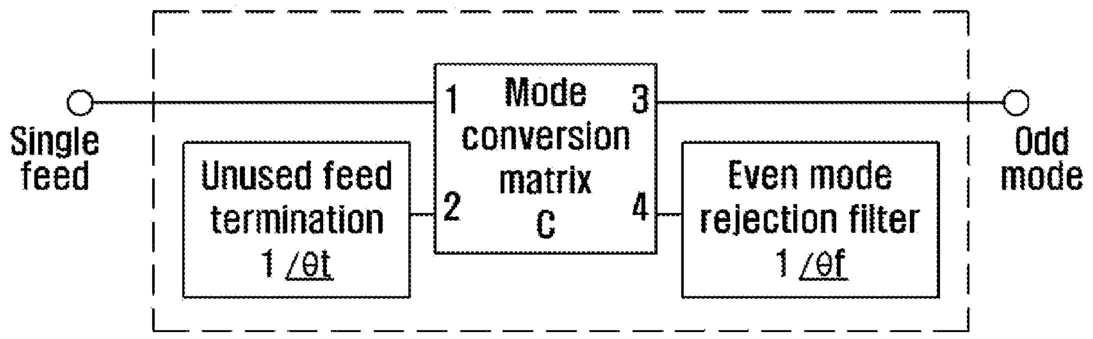

As shown in FIG. 3, two individual feed lines, which operate in a single mode, are connected to two left lines of the coupled-line. Two right lines of the coupled-line serve to feed an odd mode and an even mode.

FIG. 3 shows a view (a) for explaining ports of a coupled-line, a main component of a balun circuit according to the present invention, and a block diagram (b) used to analyze performance of the balun circuit.

The even mode is virtual port showing a case that two lines connected in the right have signals of the same size and the same phase difference. And the odd mode shows signals of the same size and a phase difference of 180°. A mode conversion matrix (C) with respect to the coupled-line may be expressed as the following formula (1).

$$C = \frac{1}{\sqrt{2}}\begin{pmatrix} 0 & 0 & 1 & 1 \\ 0 & 0 & -1 & 1 \\ 1 & -1 & 0 & 0 \\ 1 & 1 & 0 & 0 \end{pmatrix} \quad (1)$$

In order to design a balun circuit using a coupled-line having a short length, performance of the balun circuit is calculated using a block diagram as shown in FIG. 3(*b*).

Port 2 of the coupled-line connects termination of a characteristic of total reflection. Port 4, which indicates an even mode signal, is connected to a rejection filter for removing even mode. Port 1 is connected to a single mode feed, and port 3 is connected to an odd mode feed. In this case, an S-parameter with respect to the entire balun circuit is converted as shown in the following formula (2).

$$S_{balun} = \frac{1}{1 - e^{j\theta}}\begin{pmatrix} e^{j\theta_f} & \sqrt{2}(1 - e^{j\theta}) \\ \sqrt{2}(1 - e^{j\theta}) & e^{j\theta_f} \end{pmatrix} \quad (2)$$

$\theta_f$ indicates a phase in a rejection filter, $\theta_t$ indicates a phase in a reflection coefficient of total reflection termination, and $\theta$ indicates the sum of two phases.

For the rejection filter which serves to remove only an even mode, a ground surface slot structure is used in the present invention. A structure using a slot on a ground surface is called 'Defected Ground Structure' (DGS), which can be used to control impedance of a ground surface when designing an RF passive circuit.

Figure 4:
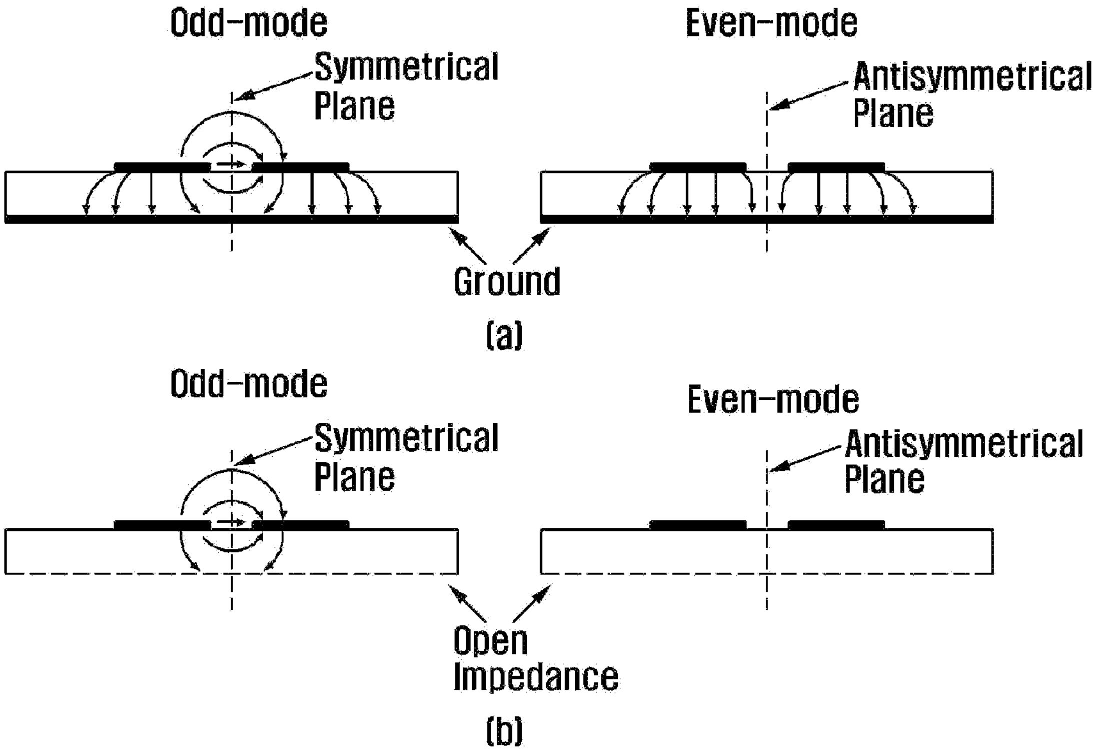
FIG. 4 shows a view schematically illustrating distribution of an electric field of an odd mode and an even mode, in a general ground surface (a) and in defected ground structure (DGS) (b)

FIG. 4 shows a view schematically illustrating distribution of an electric field of an odd mode and an even mode, in a general ground surface (a) and in defected ground structure (DGS) (b).

FIG. 4 illustrates distribution of an electric field of a coupled-line, in case of using a general ground surface and a DGS. In case of using a general ground surface, both an odd mode signal and an even mode signal can be transmitted through two lines. In case of using a DGS, a bottom surface may be formed to have open impedance. In this case, only an odd mode signal can be transmitted, but an even mode signal cannot be transmitted.

Accordingly, a function of a rejection filter for removing only an even mode can be added through the ground surface slot structure. In order for a ground surface to have open impedance characteristics around a coupled-line, a length from the end of a slot to the coupled-line is preferably formed to have 90°.

In the present invention, an 'H'-shaped slot structure is used. By such structure, loss of radiation toward a rear end of the ground surface is reduced. A reflection coefficient phase $\theta_f$ of a rejection filter is almost 0°, because the rejection filter is included in a coupled-line having a very short length.

As an analysis result on an S-parameter through formula analysis, in order to minimize mismatch (S11) of the balun circuit, $\theta$ indicating the sum of $\theta_f$ and $\theta_t$ is 180° most preferably. The phase $\theta_t$ of total reflection termination is preferably 180°, because a reflection coefficient phase $\theta_f$ of the rejection filter is almost 0°.

Total reflection termination having a phase of 180° may be simply configured as a short-circuit implemented by connecting a via to a ground surface. The mismatch (S11), which still remains in the balun circuit, can be removed by controlling line impedance between a single-end feed of an input terminal and coupled-line.

In the present invention, it is proven, through formula analysis of a short coupled-line, that the short coupled-line can operate as a balun circuit in case of adding a ground surface slot and a ground surface connection via of port 2. Such balun circuit can be simply configured on a smaller area when compared with the conventional balun circuit.

Figure 5:
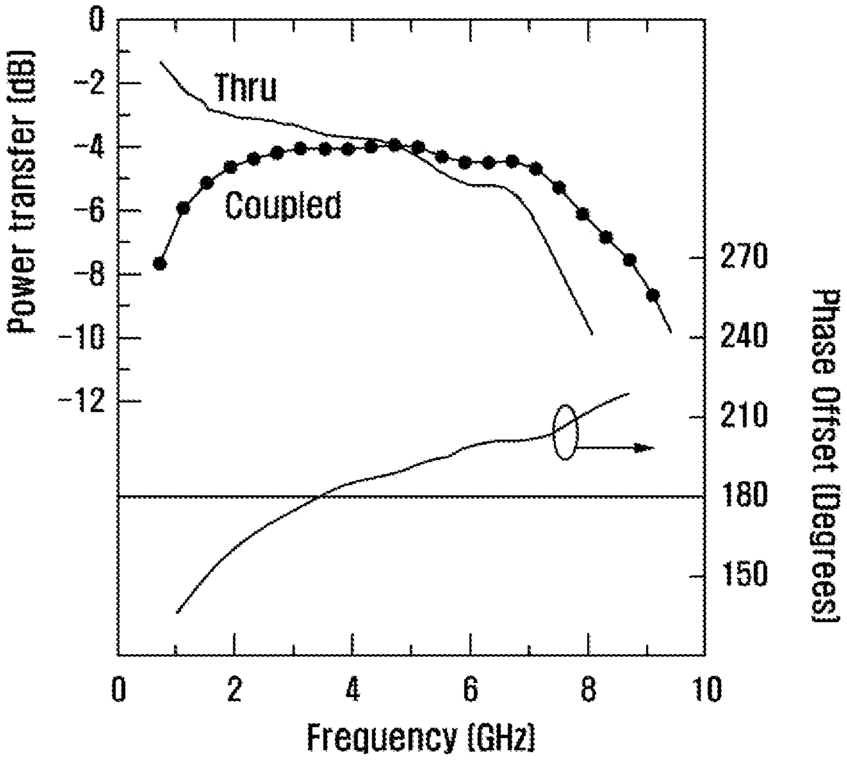
FIG. 5 shows a graph illustrating an S-parameter measurement result (a) on a small balun circuit according to the present invention, and a graph illustrating a result (b) on Even/Odd mode conversion efficiency.
Figure 5:
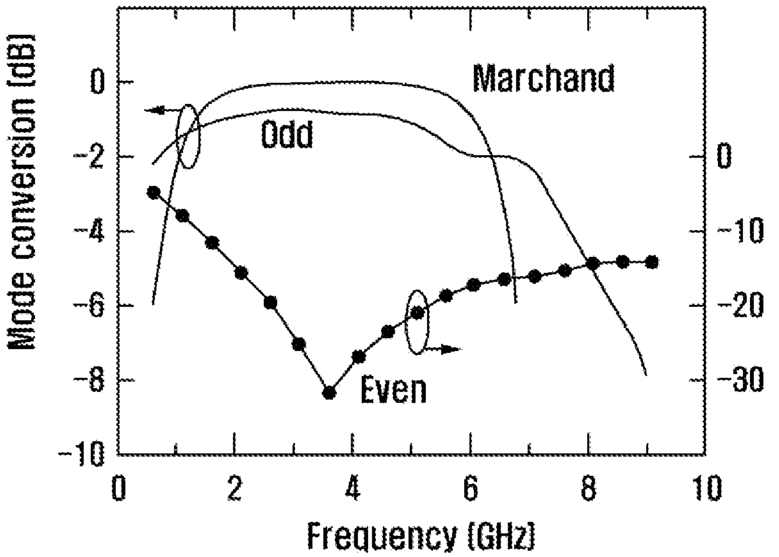

It is experimentally proven, through fabrication of a 3 GHz circuit, that the balun circuit using defected ground structure according to the present invention is normally operated. FIG. 5 shows a graph illustrating an S-parameter measurement result (a) on a small balun circuit according to the present invention, and a graph illustrating a result (b) on Even/Odd mode conversion efficiency.

FIG. 5(*a*) is a graph illustrating an S-parameter measurement result on a fabricated balun circuit. A measuring device is generally operated in a single mode. Accordingly, signals which are transmitted to an upper line (Thru) and a lower line (Coupled) of a right odd mode feed are respectively measured with respect to a signal input to a left single mode feed.

As the measurement result, a size difference of signals at two output terminals is 1.5 dB to the maximum, at a frequency ranging from 2 GHz to 6 GHz. A phase error is within 19° based on 180°. After calculating signals converted between an odd mode and an even mode using a measured S-parameter, it could be seen that only odd mode signals can be transmitted as shown in FIG. 5(*b*).

In order to check bandwidth characteristic of the small balun circuit according to the present invention, a simulation value of the present invention is compared with a simulation value of the conventional Marchand balun circuit. The simulation value of the conventional Marchand balun circuit is a result on an ideal case of no loss. A bandwidth, where odd-mode conversion is reduced by 1 dB when compared with a maximum value, is 0.7~5.6 GHz. This means that the present invention shows wideband characteristics almost similar to that of the Marchand balun.

In the present invention, a balun circuit is implemented through a simple structure that a ground surface slot has been added to a short coupled-line. The conventional balun circuits require a line having a ¼ wavelength or more. However, the balun circuit according to the present invention may be configured by a coupled-line having a short length.

Further, the conventional Marchand balun has great change in circuit characteristics according to a coupling factor of a coupled-line. On the other hand, the balun circuit of the present invention has little change due to the process error, because a coupling factor of two lines scarcely influences on performance of the balun circuit.

As a measurement result on a fabricated balun circuit, the balun circuit of the present invention shows similar bandwidth characteristics to the conventional Marchand balun, due to the conventional broadband characteristics.

The present invention relates to a technique for designing a millimeter wave band integrated circuit (IC). Especially, the present invention is applicable to design for a circuit of high frequency band more than 30 GHz where loss of a passive device occurs greatly. Further, the present invention is applicable to a product for a single chip system implemented by combining various circuits to inside of a single IC chip. More specifically, the present invention is applicable to design for a chip for 60 GHz communication system, a chip for 77 GHz car radar system, and a chip for 94 GHz RF-imaging system.

While the present invention has been shown and described in connection with the exemplary embodiments, it will be apparent to those skilled in the art that modifications and variations can be made without departing from the spirit and scope of the invention as defined by the appended claims.

The invention claimed is:

1. A balun circuit using defected ground structure, comprising:

a substrate;

a ground surface formed on one surface of the substrate, the ground surface being formed with defect structure in a previously set shape; and two transmission lines formed on the other surface of the substrate opposing the ground surface, and separated from each other, wherein the defect structure of the ground surface is configured to have open circuit impedance characteristics, and one of the two transmission lines is grounded, wherein the defect structure includes a slot form configured in a direction crossing the two transmission lines, and wherein a distance from an end portion of the defect structure to a part of the defect structure positioned at an opposite side to the transmission lines is within the range of 80°~100° of a transmission signal waveform, wherein the defect structure is formed to have an 'H' shape symmetrical to the slot form.

2. The balun circuit using defected ground structure of claim 1, wherein the grounded transmission line is connected to the ground surface.

* * * * *